United States Patent
Wu et al.

(10) Patent No.: US 7,117,426 B2
(45) Date of Patent: Oct. 3, 2006

(54) BRANCH METRIC COMPUTATION AND ADD-COMPARE-SELECT OPERATION IN VITERBI DECODERS

(75) Inventors: Kuo-Ming Wu, Hsinchu (TW); Shih-Chung Yin, Hsinchu (TW)

(73) Assignee: Mediatek Inc., Hsinchu (TW)

( * ) Notice: Subject to any disclaimer, the term of this patent is extended or adjusted under 35 U.S.C. 154(b) by 489 days.

(21) Appl. No.: 10/724,655

(22) Filed: Dec. 1, 2003

(65) Prior Publication Data

US 2005/0120287 A1 Jun. 2, 2005

(51) Int. Cl.
*H03M 13/03* (2006.01)

(52) U.S. Cl. .................. 714/795; 714/786; 714/793; 714/792

(58) Field of Classification Search ............. 714/795, 714/786, 792, 773, 794, 798, 800, 799
See application file for complete search history.

(56) References Cited

U.S. PATENT DOCUMENTS 5,349,608 A * 9/1994 Graham et al. ............. 375/341
6,813,744 B1 * 11/2004 Traeber ...................... 714/795

* cited by examiner

*Primary Examiner*—Albert Decady
*Assistant Examiner*—Fritz Alphonse
(74) *Attorney, Agent, or Firm*—Thomas, Kayden, Horstemeyer & Risley

(57) ABSTRACT

An apparatus for branch metric computation and add-compare-select operation in a rate 1/n Viterbi decoder with a constraint length of K. The apparatus of the invention includes a branch metric generator and an add-compare-select unit. The branch metric generator calculates a plurality of branch metrics each of which is a measure between a currently received data symbol and a corresponding branch label. The add-compare-select unit can generate respective decision bits for a pair of odd and even states at next instant with a novel pre-computational architecture. Further, a local winner between the odd and even states is predetermined in a manner providing reduction of the activity required by the computation. Thus the add-compare-select unit outputs a path metric of the local winner, whereby a saving of half the output number of path metrics is achieved.

20 Claims, 6 Drawing Sheets

BRANCH METRIC COMPUTATION AND ADD-COMPARE-SELECT OPERATION IN VITERBI DECODERS

BACKGROUND OF THE INVENTION

1. Field of the Invention

The invention relates to digital communication systems, and more particularly to branch metric computation and add-compare-select operation in Viterbi decoders.

2. Description of the Related Art

In wired and wireless applications, especially wireless LAN (WLAN), finite signal and noise powers lead to a strong probability that any bit in any message may be corrupted. These corrupted bits incur errors in wireless transmission, causing troubles like lower data rates or lost transmissions. Forward error correction (FEC) techniques have been developed to account and correct for corrupted bits. The purpose of FEC is to improve the capacity of a channel by adding some carefully designed redundant information to the data being transmitted through the channel. The process of adding this redundant information is known as channel coding. Convolutional coding and block coding are two major forms of channel coding. Convolutional codes operate on a continuous input stream, one or a few bits at a time, which offer an alternative to block codes for transmission over a noisy channel.

A convolutional encoder is a Mealy machine, where the output is a function of the current machine state and the current input. In general, convolutional codes are described by two parameters: the coding rate and the constraint length. The coding rate, k/n, is expressed as a ratio of the number of bits into the convolutional encoder (k) to the number of channel symbols output by the convolutional encoder (n) in a given encoder cycle. The constraint length, K, denotes the "length" of the convolutional encoder, i.e., how many k-bit stages are available to feed the combinational logic that produces the output symbols.

In 1967, Andrew J. Viterbi introduced a decoding algorithm for convolutional codes which has become known as the Viterbi algorithm. The Viterbi algorithm is defined in terms of a graph which is called a trellis diagram. A trellis diagram is a 2-dimensional array of nodes that are connected with arcs, namely branches. Each column in the array contains $2^{K-1}$ nodes which represent the $2^{K-1}$ states of the convolutional encoder. In each stage of the encoding procedure, the encoder receives a k-bit symbol, outputs an n-bit symbol based on its current state and the input symbol, and enters a new state which is a function of its current state and the input symbol. An arc in the trellis diagram from row p in column i to row u in column i+1 corresponds to the encoder going from state p at instant i of the encoding procedure to state u at instant i+1. When applied to a sequence of symbols received from a memory-less channel, in an iterative manner, the Viterbi algorithm finds the maximum likelihood path through the trellis diagram and thereby outputs the decoded data.

Viterbi decoding has been the subject of several United States patents including U.S. Pat. No. 5,878,060, U.S. Pat. No. 5,912,908, and U.S. Pat. No. 6,415,415. An advantage of the Viterbi decoding is the fixed decoding time. The Viterbi algorithm is well suited to hardware decoder implementation, but its computational requirements grow exponentially as a function of the constraint length. Traditionally, performance and silicon area are the two most important concerns in VLSI design. In recent years, power dissipation has also become an important concern, especially in battery-powered applications, such as cellular phones, laptop computers, and WLAN adapters. Compared with a K=5 convolutional code for use in GSM systems, the convolutional code specified in the IEEE 802.11a/g standard has a constraint length of K=7. As the constraint length increases, the decoding process in the receiver becomes increasingly complicated and consumes more power. Several studies have shown that the Viterbi decoder consumes more than one-third of the chip area and the power dissipation of the baseband modem. Accordingly, there is a need for a novel and efficient scheme that can reduce the complexity and power consumption of the Viterbi decoder.

SUMMARY OF THE INVENTION

The present invention is generally directed to an apparatus for branch metric computation and add-compare-select operation in a rate 1/n Viterbi decoder with a constraint length of K. The apparatus of the invention comprises a branch metric generator and an add-compare-select unit. The branch metric generator receives a data symbol including n decision metrics in Q-bit representation to calculate a plurality of branch metrics each of which is a measure between the currently received data symbol and a corresponding branch label. A branch metric difference is further pre-calculated by subtracting a first branch metric of a transition from state $S_p$ to state $S_u$ at instant i from a second branch metric of another transition from state $S_q$ to state $S_u$ at instant i.

The add-compare-select unit receives the branch metric difference, the first and the second branch metrics at instant i from the branch metric generator. It calculates a path metric difference between a path metric of state $S_p$ at instant i−1 and another path metric of state $S_q$ at instant i−1. Two decision bits of states $S_u$ and $S_v$ at instant i are set, respectively, based on the branch metric difference at instant i and the path metric difference. The add-compare-select unit includes a first adding means for calculating a new path metric for state $S_u$ at instant i and a second adding means for calculating another new path metric for state $S_v$ at instant i. According to the decision bit of state $S_u$ at instant i, the first adding means is capable of selectively adding the path metric of state $S_q$ at instant i−1 and the second branch metric of the transition from state $S_q$ to state $S_u$ at instant i or adding the path metric of state $S_p$ at instant i−1 and the first branch metric of the transition from state $S_p$ to state $S_u$ at instant i. According to the decision bit of state $S_v$ at instant i, the second adding means is capable of selectively adding the path metric of state $S_q$ at instant i−1 and the first branch metric of the transition from state $S_p$ to state $S_u$ at instant i or adding the path metric of state $S_p$ at instant i−1 and the second branch metric of the transition from state $S_q$ to state $S_u$ at instant i. The add-compare-select unit preferably comprises means for selectively outputting one of the new path metrics, which is a survivor path metric of a local winner state, by predetermining the local winner state between states $S_u$ and $S_v$ at instant i based on the decision bits of states $S_u$ and $S_v$ at instant i, and the sign of the path metric difference at instant i−1 or the sign of the branch metric difference at instant i. Note that states $S_p$ and $S_q$ at instant i−1 and states $S_u$ and $S_v$ at instant i are organized in a butterfly trellis structure.

According to another aspect of the invention, an add-compare-select apparatus for a Viterbi decoder comprises a subtractor, a λ-bit multiplexer, a λ-bit unsigned comparator, two combinational-logic circuits, and two adding means. The subtractor calculates a path metric difference by subtracting a path metric of state $S_q$ at instant i−1 from another path metric of state $S_p$ at instant i−1, where the path metrics are represented by α bits of precision, respectively. The λ-bit multiplexer selectively provides an output between λ least significant bits of a branch metric difference at instant i and the negative thereof according to a select signal, where the branch metric difference is represented by β bits of precision and β=λ+1. The λ-bit unsigned comparator generates a comparison result by comparing the magnitude of λ least significant bits of the α-bit path metric difference and the magnitude of the λ-bit multiplexer output.

A first combinational-logic circuit is responsible for logically operating δ most significant bits of the α-bit path metric difference and a sign bit of the branch metric difference at instant i to predetermine whether the magnitude of the α-bit path metric difference is greater or less than that of the branch metric difference, where δ=α−λ. If this predetermination is met, a decision bit is set for state $S_u$ at instant i based on the predetermination; otherwise, the decision bit of state $S_u$ at instant i is set to be consistent with the comparison result. On the other hand, a second combinational-logic circuit is responsible for logically operating δ most significant bits of the α-bit path metric difference and the sign bit of the branch metric difference at instant i to predetermine whether the magnitude of the α-bit path metric difference is greater or less than that of the negative of the branch metric difference. If this predetermination is met, a decision bit is set for state $S_v$ at instant i based on the predetermination; otherwise, the decision bit of state $S_v$ at instant i is set to be consistent with the comparison result.

According to the decision bit of state $S_u$ at instant i, the first adding means can calculate a new path metric for state $S_u$ at instant i by selectively adding the path metric of state $S_q$ at instant i−1 and a branch metric of a transition from state $S_q$ to state $S_u$ at instant i or adding the path metric of state $S_p$ at instant i−1 and another branch metric of a second transition from state $S_p$ to state $S_u$ at instant i, where the branch metrics are represented by λ bits of precision. According to the decision bit of state $S_v$ at instant i, the second adding means can calculate another new path metric for state $S_v$ at instant i by selectively adding the path metric of state $S_q$ at instant i−1 and the branch metric of the second transition from state $S_p$ to state $S_u$ at instant i or adding the path metric of state $S_p$ at instant i−1 and the branch metric of the transition from state $S_q$ to state $S_u$ at instant i. Preferably, the branch metric difference is pre-calculated by subtracting the branch metric of the second transition from state $S_p$ to state $S_u$ at instant i from the branch metric of the transition from state $S_q$ to state $S_u$ at instant i.

According to yet another aspect of the invention, a rate 1/n Viterbi decoder with a constraint length of K is composed of a dummy insertion unit, a branch metric generator, multiple add-compare-select units, and a survivor memory unit. The dummy insertion unit performs a dummy insertion procedure, which is inverse to a bit-stealing procedure in a transmitter, on a sequence of decision metrics in Q-bit representation according to a puncturing pattern; it also outputs a dummy insertion flag to indicate a position at which a dummy value is inserted into the decision metrics. The branch metric generator receives n number of the decision metrics including the dummy value to group into a data symbol to calculate a plurality of branch metrics each of which is a distance between the data symbol and a corresponding branch label. When the branch metrics are calculated for the data symbol, the inserted dummy value is ignored in response to the dummy insertion flag. Further, a branch metric difference is pre-calculated for a pth sub-group of states including states $S_p$, $S_q$, $S_u$ and $S_v$ by subtracting a first branch metric of a transition from state $S_p$ to state $S_u$ at instant i from a second branch metric of another transition from state $S_q$ to state $S_u$ at instant i. Preferably, states $S_p$ and $S_q$ at instant i−1 and states $S_u$ and $S_v$ at instant i are organized in a butterfly trellis structure.

Among the P add-compare-select units, the pth unit receives the first branch metric of the transition from state $S_p$ to state $S_u$, the second branch metric of the transition from state $S_q$ to state $S_u$ and the branch metric difference for the pth sub-group of states at instant i from the branch metric generator. The pth add-compare-select unit also calculates a path metric difference between a path metric of state $S_p$ at instant i−1 and another path metric of state $S_q$ at instant i−1. With the pth add-compare-select unit, a pair of decision bits are set for states $S_u$ and $S_v$ at instant i based on the branch metric difference at instant i and the path metric difference. In addition, new path metrics are generated for states $S_u$ and $S_v$ at instant i, respectively. The pth add-compare-select unit can further predetermine a local winner state between states $S_u$ and $S_v$ at instant i based on the decision bits of states $S_u$ and $S_v$ at instant i, and the sign of the branch metric difference at instant i or the sign of the path metric difference. One of the new path metrics, which is a survivor path metric of the local winner state at instant i, is provided as output. Thus P add-compare-select units can reduce half the output number of path metrics. The survivor memory unit receives P survivor path metrics of P local winner states and P pairs of decision bits at instant i from the P add-compare-select units; it is thus responsible for storing survivor path sequences and yielding a decoded bit sequence.

DESCRIPTION OF THE DRAWINGS

The present invention will be described by way of exemplary embodiments, but not limitations, illustrated in the accompanying drawings in which like references denote similar elements, and in which.

DETAILED DESCRIPTION OF THE INVENTION

The present invention will now be described with reference to a wireless communication system that conforms to the IEEE 802.11a/g standard. According to the invention, the communication system need not be wireless and the conformant 802.11a/g transceiver referred to herein is merely an exemplary illustration. In the example of a conformant 802.11a/g transceiver, the convolutional encoder generates two output bits for every input bit using a code with a constraint length K=7. Therefore, its Viterbi decoder has a coding rate k/n equal to 1/2. The constraint length K=7 means that there are $2^{7-1}$=64 states of the encoder (since the seventh bit is the input bit). These states are designated as state $S_0$ (decimal 0, binary 000000) to state $S_{63}$ (decimal 63, binary 111111). The IEEE 802.11a/g standard adopts puncturing technique to achieve higher data rate. Puncturing is a bit-stealing procedure for omitting some of encoded bits in the transmitter, thereby reducing the number of transmitted bits and increasing the coding rate. For example, if a bit sequence of $A_1 B_1 A_2 B_2$ has the bit $B_2$ omitted, it becomes $A_1 B_1 A_2$ p where p denotes the punctured bit. Instead of transmitting four encoded bits to represent two bits of data (coding rate R=2/4 or 1/2), three bits are transmitted now to represent the same two bits of data for R=2/3. A rate R=3/4 can be generated in a similar manner.

Figure 1:
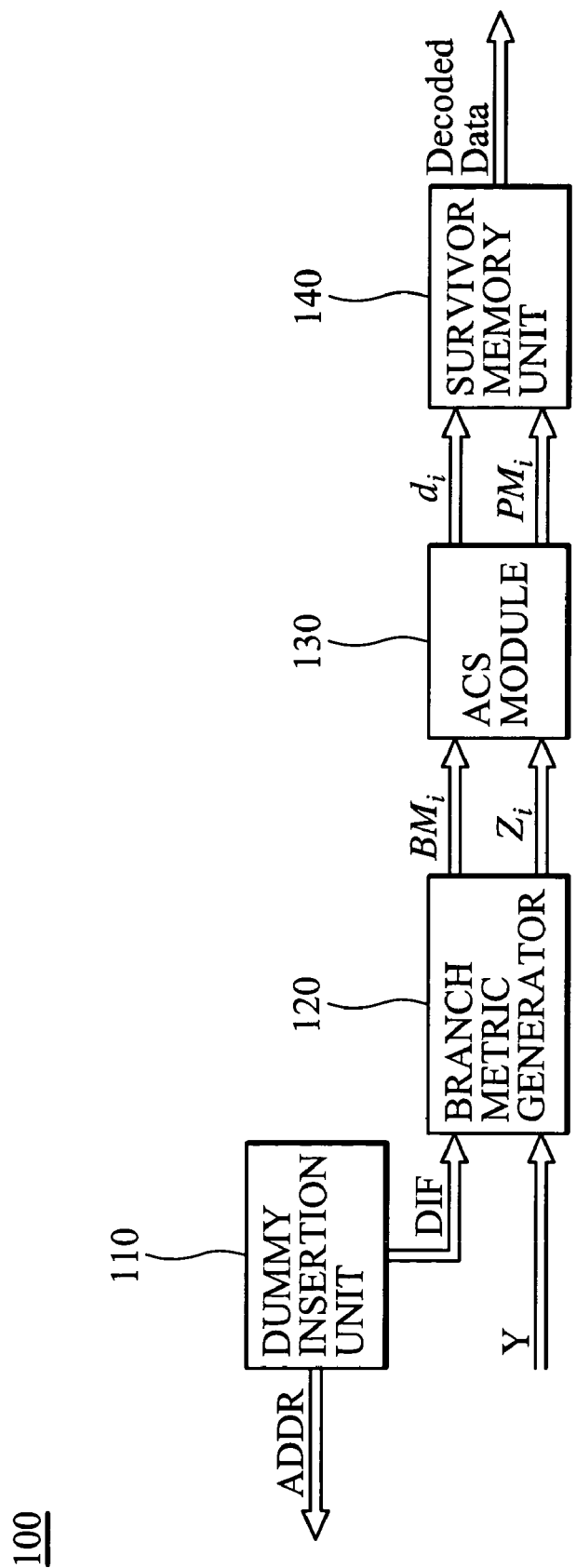
FIG. 1 is a block diagram of a Viterbi decoder according to an embodiment of the invention.

Referring to FIG. 1, a rate 1/n Viterbi decoder with a constraint length of K according to an embodiment of the invention is illustrated and identified by the reference numeral 100. The Viterbi decoder 100 has four main blocks including a dummy insertion unit 110, a branch metric generator 120, an add-compare-select (ACS) module 130, and a survivor memory unit 140. The dummy insertion unit 110 is responsible for inserting dummy data into the Viterbi decoder 100 on the receive side in place of the previously punctured bits. It performs a dummy insertion procedure inverse to the bit-stealing procedure according to a puncturing pattern (i.e., the coding rate). In this regard, the dummy insertion unit 110 retrieves a sequence of decision metrics from a buffer in the preceding module by generating two column addresses, ADDR0 and ADDR1, where the decision metrics are arranged in order of time received and the earliest one is in address 0. The preceding module can deliver either hard-decision or soft-decision values to the Viterbi decoder 100. If the decision metrics are quantized to one-bit precision, the result is called hard-decision data. If the decision metrics are quantized with more than one bit of precision, the result is called soft-decision data. In the case of the conformant 802.11a/g receiver, the dummy insertion procedure can be classified into three operating modes and represented by way of the following expression:

```
Mode 0 (coding rate R = 1 / 2)
    for (count = 0; count++; count < N_DBPS)
    {
        ADDR0 = count × 2 ;
        ADDR1 = count × 2 + 1 ;
    }
Mode 1 (coding rate R = 2 / 3)
    for (count = 0; count++; count < N_DBPS)
    {
        if ((count mod 2) == 0)
        {
            ADDR0 = count × 3/2 ;
            ADDR1 = count × 3/2 + 1 ;
        }
        if ((count mod 2) == 1)
        {
            ADDR0 = (count − 1) × 3/2 + 2 ;
            /* insert a dummy value, ADDR1: don't care */
        }
    }
Mode 2 (coding rate R = 3 / 4)
    for (count = 0; count++; count < N_DBPS)
    {
        if ((count mod 3) == 0)
        {
            ADDR0 = count × 4/3 ;
            ADDR1 = count × 4/3 + 1 ;
        }
        if ((count mod 3) == 1)
        {
            ADDR0 = (count − 1) × 4/3 + 2 ;
            /* insert a dummy value, ADDR1: don't care */
        }
        if ((count mod 3) == 2)
```

-continued

```
        {
            /* insert a dummy value, ADDR0: don't care */
            ADDR1 = (count − 2) × 4/3 + 3 ;
        }
    }
```

Note that a cycle-based counter, count, is built in the dummy insertion unit 110 to generate the count from 0 to $N_{DBPS}-1$, where $N_{DBPS}$ is the number of data bits per OFDM symbol. Furthermore, the dummy insertion unit 110 outputs a dummy insertion flag, DIF, to indicate a position at which a dummy value is inserted into a sequence of decision metrics. Using the column addresses ADDR0 and ADDR1, $N_{CBPS}$ decision metrics are retrieved in $N_{DBPS}$ clock cycles according to the puncturing pattern, where $N_{CBPS}$ is the number of coded bits in an OFDM symbol. After retrieving $N_{CBPS}$ decision metrics, the operation of the dummy insertion unit 110 is suspended and the built-in counter is reset to zero.

The branch metric generator 120 accepts the dummy insertion flag DIF and a sequence Y at its inputs as shown in FIG. 1. For example, the sequence Y can be formed with the appropriately inserted dummy values and the retrieved decision metrics that are soft-decision values in Q-bit representation. Every group of n values in the sequence Y is organized into a data symbol $y_i$. It should be understood to those skilled in the art that 1-bit hard-decision values may also substitute for the exemplificative soft-decision values. The branch metric generator 120 is responsible for branch metric computation which provides a measurement. Such a measurement, referred to as the branch metric, is an inverse of the likelihood that a given branch from a current state to a next state is correct. For a rate 1/n Viterbi decoder, there are two possible state transitions and thus two branch metrics are calculated for each next state by measuring the difference between the received data symbol at a given instant and two associated branch labels. A branch label on a given branch specifies which value the encoder output. Although there are 64 encoder states for 802.11a/g, a total of four branch metrics are calculated for each data symbol $y_i$ because the rate 1/2 encoder can only output a symbol having a maximum of four possible values. Considering the dummy insertion, the branch metric generator 120 ignores the appropriately inserted dummy values in response to the dummy insertion flag when calculating the branch metrics. In FIG. 1, the branch metrics generated at instant i by the branch metric generator 120 are referred to as $BM_i$. More particularly, a branch metric of a transition from state S' to state S at instant i is denoted by $BM_i^{(S',S)}$. According to the invention, the branch metric generator 120 further precalculates a branch metric difference $Z_i$ for the subsequent add-compare-select operation, which will be described in detail later.

Figure 2:
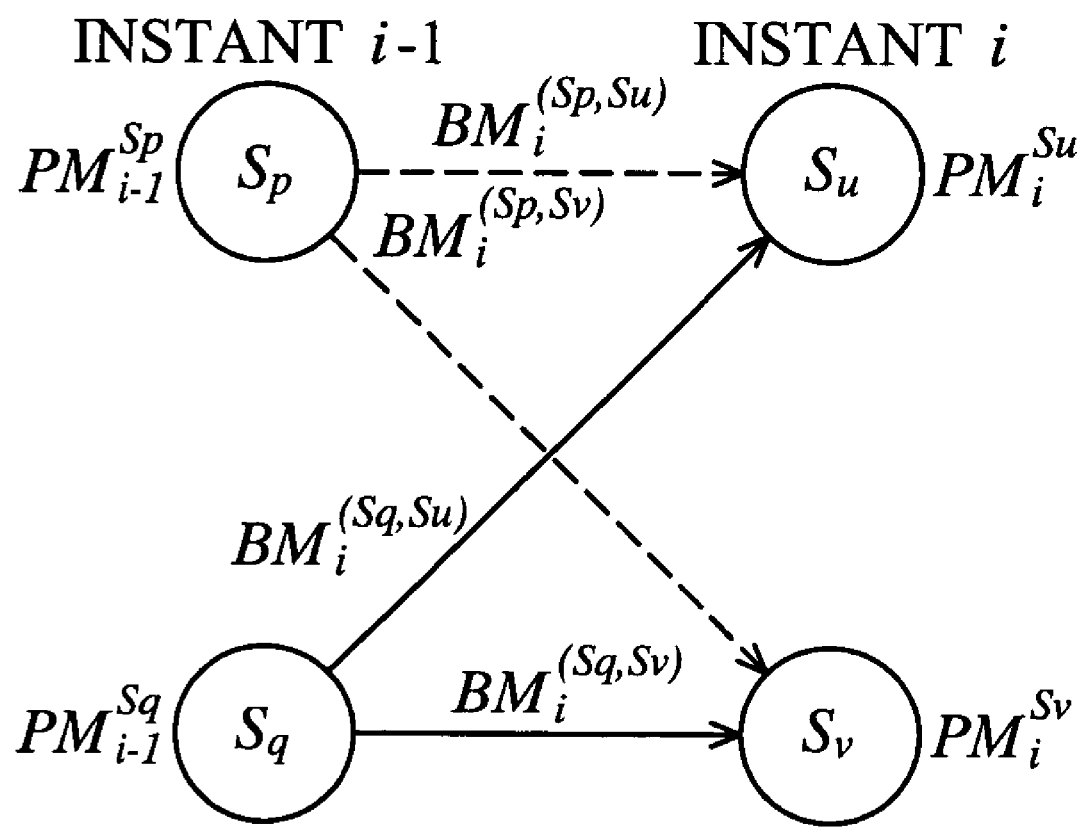
FIG. 2 is a graph showing a basic unit of the butterfly trellis structure.

Still referring to FIG. 1, the ACS module 130 receives the output of the branch metric generator 120 and generates a path metric $PM_i$ and a decision bit $d_i$ for each next state. According to the invention, the trellis diagram for the rate 1/n encoder with a constraint length of K is organized in a butterfly structure. FIG. 2 shows a basic element of the butterfly trellis structure. Four possible state transitions from instant i to instant i−1 are illustrated. The following relations shown in FIG. 2 are established for a rate 1/n, constraint length K Viterbi decoder:

$$p=0, 1, 2, \ldots, 2^{K-2}-1$$

$$q=2^{K-2}+p$$

$$u=2p$$

$$v=2p+1$$

$$PM_i^{S_u}=\min(PM_{i-1}^{S_p}+BM_i^{(S_p,S_u)}, PM_{i-1}^{S_q}+BM_i^{(S_q,S_u)})$$

$$PM_i^{S_v}=\min(PM_{i-1}^{S_p}+BM_i^{(S_p,S_v)}, PM_{i-1}^{S_q}+BM_i^{(S_q,S_v)})$$

Here $PM_i^S$ denotes a path metric of the survivor path entering state S at instant i. It is important to note that u is even and v is odd. This implies that an odd (even) state is reached only if the source input bit is '1' ('0'). In other words, state $S_u$ can be reached from either state $S_p$ or $S_q$ when the source input bit is '0'. Similarly, state $S_v$ can be reached from either state $S_p$ or $S_q$ when the source input bit is '1'. In Viterbi decoding, the decision bit indicates which sum of a source path metric and a branch metric generated the smallest result and was selected as a new path metric. If the decision bit of a state at instant i is '0', the associated upper branch (the dashed line in FIG. 2) is the survivor path leading to a predecessor state. If it is '1', the lower branch (the solid line in FIG. 2) will be chosen.

One important property of the convolutional code specified in IEEE 802.11a/g is that $BM_i^{(S_p,S_u)}=BM_i^{(S_q,S_v)}$ and $BM_i^{(S_p,S_v)}=BM_i^{(S_q,S_u)}$. This property can be applied to jointly calculate the path metrics $PM_i^{S_u}$ and $PM_i^{S_v}$. For calculating $PM_i^{S_u}$, instead of finding the minimum between $PM^{i-1,S_p}+BM_i^{(S_p,S_u)}$ and $PM_{i-1}^{S_q}+BM_i^{(S_q,S_u)}$, the values of $W_i=PM_{i-1}^{S_p}-PM_{i-1}^{S_q}$ and $Z_i=BM_i^{(S_q,S_u)}-BM_i^{(S_p,S_u)}$ are compared. If $W_i<Z_i$, it means $PM_{i-1}^{S_p}+BM_i^{(S_p,S_u)}<PM_{i-1}^{S_q}+BM_i^{(S_q,S_u)}$ and vice versa. Now for calculating $PM_i^{S_v}$, the values of $W_i=PM_{i-1}^{S_p}-PM_{i-1}^{S_q}$ and $-Z_i=BM_i^{(S_q,S_u)}-BM_i^{(S_p,S_u)}=BM_i^{(S_p,S_u)}-BM_i^{(S_q,S_u)}$ are compared, where $Z_i$ and $-Z_i$ are opposite numbers. As mentioned earlier, the branch metric difference $Z_i$ is pre-calculated in the branch metric generator 120 by subtracting $BM_i^{(S_p,S_u)}$ from $BM_i^{(S_q,S_u)}$. The other branch metric difference, $-Z_i$, can be obtained from the negative of $Z_i$. Note that both calculations of $PM_i^{S_u}$ and $PM_i^{S_v}$ share the term $W_i$, and thus one computation can be reduced. Also, the additions and subtractions are carried out with smaller bit-width. This results in lower complexity and power consumption.

Figure 3:
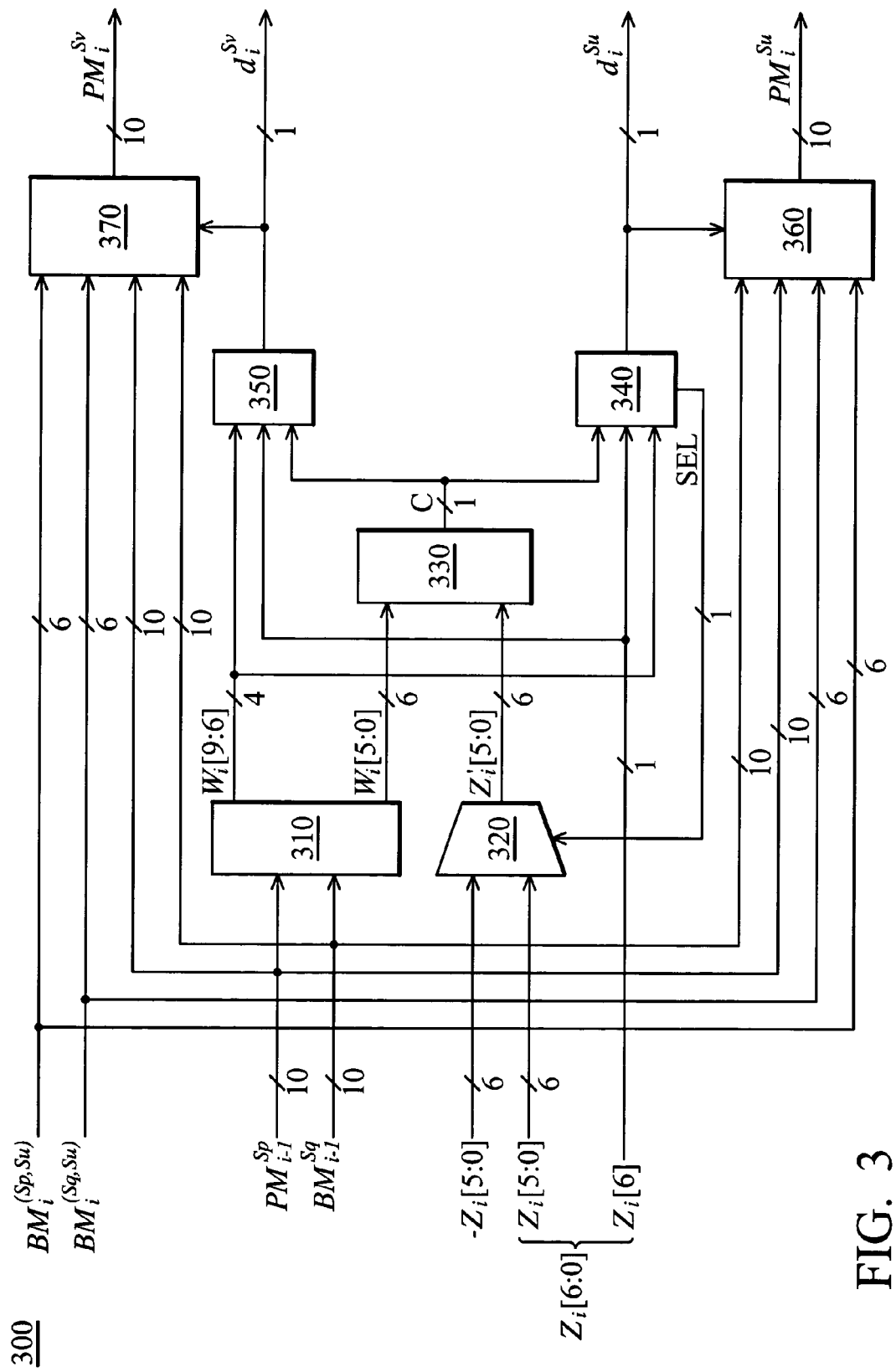
FIG. 3 is a block diagram of an add-compare-select unit according to an embodiment of the invention.

The ACS module 130 preferably comprises P number of ACS units each responsible for a basic butterfly element. The number of necessary ACS units is equal to half the number of total states, that is, $P=2^{K-2}$. FIG. 3 shows a detailed block diagram of the pth ACS unit in the ACS module 130. The pth ACS unit 300 is made up of a subtractor 310, a $\lambda$-bit multiplexer 320, a $\lambda$-bit unsigned comparator 330, two combinational-logic circuits 340 and 350, and two adding means 360 and 370. To begin with, the branch metrics are represented by $\lambda$ bits of precision, in which $\lambda$ is given by:

$$\lambda=Q+n-1$$

The number of bits required to represent the branch metric difference is $\beta=\lambda+1$. On the other hand, the path metrics are represented by $\alpha$ bits of precision and $\alpha$ is given by an equation of the form:

$$\alpha=1+\lceil \log_2(n \cdot K(2^Q-1)) \rceil$$

where $\lceil \cdot \rceil$ denotes a ceiling function which returns the smallest integer greater than or equal to the given numeric expression. For example, the decision metrics are quantized into 32 levels, i.e., they are represented by Q=5 bits of precision. In this case, $\alpha$ is 10, $\beta$ is 7, and $\lambda$ is 6 for a rate 1/2, K=7 Viterbi decoder (n=2). It should be understood that $\alpha$, $\beta$, and $\lambda$ stand for the optimums according to the present disclosure; they may also be replaced with other values, as will be appreciated by those skilled in the art. The subtractor 310 calculates the path metric difference $W_i$ by subtracting $PM_{i-1}^{S_q}$ from $PM_{i-1}^{S_p}$. The 6-bit multiplexer 320 selectively provides an output between 6 least significant bits (LSBs) of $Z_i$ and $-Z_i$ according to a select signal SEL. The 6-bit unsigned comparator 330 is used to generate a comparison result, C, by comparing the magnitude of 6 LSBs of the 10-bit path metric difference, $W_i[5:0]$, and the magnitude of the 6-bit multiplexer output, $Z'_i[5:0]$.

The combinational-logic circuits 340 and 350 are responsible for logically operating $\delta$ most significant bits (MSBs) of the $\alpha$-bit path metric difference, the comparison result C, and a sign bit of the branch metric difference at instant i, where $\delta=\alpha-\lambda$. In the case of a rate 1/2, K=7 Viterbi decoder, 4 MSBs of the 10-bit path metric difference, $W_i[9:6]$, are applied to the combinational-logic circuits 340 and 350 both. As shown in FIG. 3, the comparison result C and the sign bit of the 7-bit branch metric difference, $Z_i[6]$, are applied to the combinational-logic circuits 340 and 350 as well. According to the invention, the combinational-logic circuit 340 is capable of predetermining whether the magnitude of the path metric difference is greater or less than that of the branch metric difference based on $W_i[9:6]$ and $Z_i[6]$. If the predetermination is met, i.e., it gives a decisive answer, a decision bit, $d_i^{S_u}$, can be set for state $S_u$ at instant i based on the predetermination; otherwise, $d_i^{S_u}$ is set to be consistent with the comparison result C. On the other hand, the combinational-logic circuit 350 is capable of predetermining whether the magnitude of the path metric difference is greater or less than that of the negative of the branch metric difference based on $W_i[9:6]$ and $Z_i[6]$. If so, a decision bit, $d_i^{S_v}$, can be set for state $S_v$ at instant i based on this predetermination. Provided that the predetermination is not met, i.e., it cannot give a decisive answer, $d_i^{S_v}$ is set to be consistent with the comparison result C.

Figure 4A:
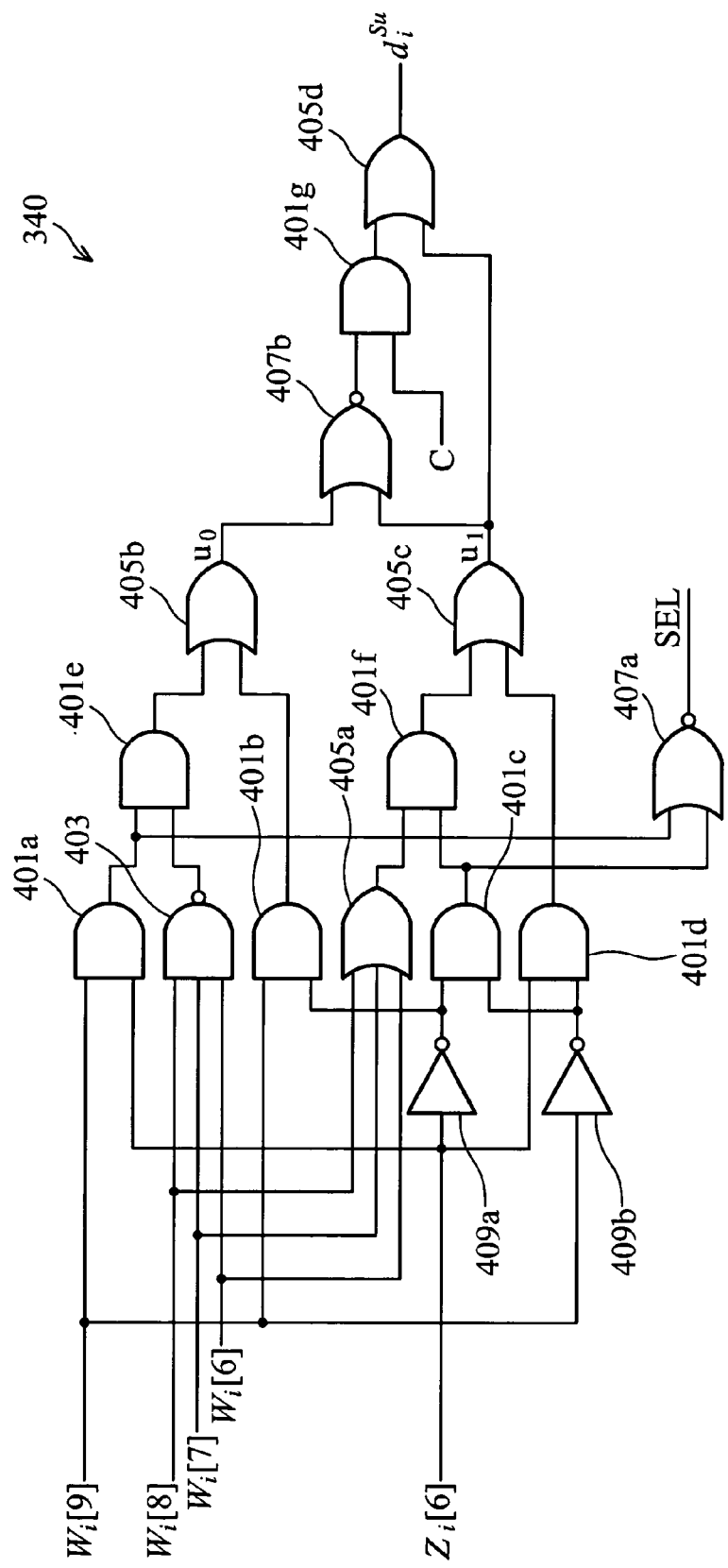
FIG. 4A is a logic diagram of a first combinational-logic circuit according an embodiment of the invention.

Referring to FIG. 4A, a logic diagram of the combinational-logic circuit 340 according to an embodiment of the invention is illustrated. It is seen that the combinational-logic circuit 340 is implemented with AND gates 401a–g, NAND gate 403, OR gates 405a–d, NOR gates 407a–b, and NOT gates 409a–b. The logic diagram of FIG. 4A can be summarized by the following Boolean expressions:

$$u_0=W_i[9]\overline{Z_i[6]}+((W_i[9]\cdot Z_i[6])\cdot(\overline{W_i[8]\cdot W_i[7]\cdot W_i[6]}))$$

$$u_1=\overline{W_i[9]}\cdot Z_i[6]+((\overline{W_i[9]}\cdot \overline{Z_i[6]})\cdot(W_i[8]+W_i[7]+W_i[6]))$$

$$d_i^{S_u}=u_1+(C\cdot(\overline{u_0+u_1}))$$

$$\text{SEL}=\overline{W_i[9]}\cdot Z_i[6]+\overline{W_i[9]}\cdot \overline{Z_i[6]}$$

Figure 4B:
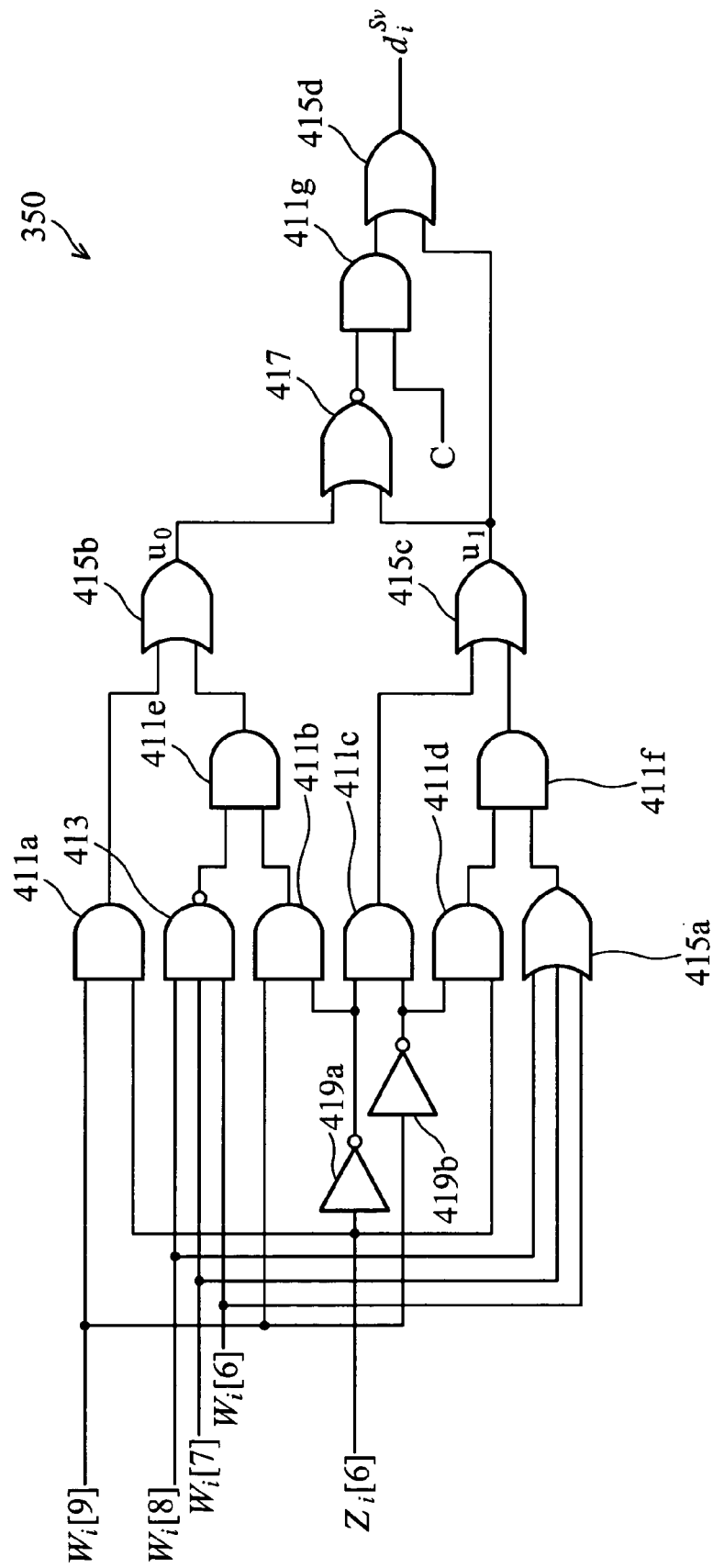
FIG. 4B is a logic diagram of a second combinational-logic circuit according an embodiment of the invention.

As such, $W_i[9:6]$ and $Z_i[6]$ are used to predetermine the magnitude comparison between $W_i$ and $Z_i$. When the predetermination is met, i.e., either $u_0$ or $u_1$ is '1', the comparison result C from the 6-bit unsigned comparator 330 is disabled by the AND gate 401g. As a result, $d_i^{S_u}$ follows the value of $u_1$. In this case, the decision bit can be set for state $S_u$ at instant i based on the predetermination. Conversely, both $u_0$ and $u_1$ become '0' when $W_i$ and $Z_i$ have the same sign and $W_i[8:6]$ cannot give additional information about the magnitude comparison. Therefore, the predetermination is not met and the comparison result C is enabled to set $d_i^{S_u}$. Note that the select signal SEL is '0' when $W_i$ and $Z_i$ both have the same sign. Accordingly, the 6-bit multiplexer 320 selects $Z_i[5:0]$ for the 6-bit comparator 330 so that the comparison result C is generated irrespective of the sign by comparing the magnitude of $W_i[5:0]$ and $Z_i[5:0]$. Similarly, a logic diagram of the combinational-logic circuit 350 according to an embodiment of the invention is illustrated in FIG. 4B. As depicted, the combinational-logic circuit 350 is implemented with AND gates 411a–g, NAND gate 413, OR gates 415a–d, NOR gate 417, and NOT gates 419a–b. The Boolean expressions for the logic diagram of FIG. 4B are described as follows:

$$v_0 = W_i[9] \cdot Z_i[6] + ((W_i[9] \cdot \overline{Z_i[6]})(W_i[8] \cdot W_i[7] \cdot W_i[6]))$$

$$v_1 = \overline{W_i[9]} \cdot Z_i[6] + ((W_i[9] \cdot Z_i[6])(W_i[8] + W_i[7] + W_i[6]))$$

$$d_i^{S_v} = v_1 + (C \cdot (\overline{v_0 + v_1}))$$

Also, $W_i[9:6]$ and $Z_i[6]$ are used to predetermine the magnitude comparison between $W_i$ and $-Z_i$. When the predetermination is met, i.e., either $v_0$ or $v_1$ is '1', the comparison result C is disabled by the AND gate 411g so that $d_i^{S_u}$ follows the value of $u_1$. On the other hand, both $v_0$ and $v_1$ become '0' when $W_i$ and $-Z_i$ have the same sign and $W_i[8:6]$ cannot give additional information about the magnitude comparison. Therefore, the predetermination is not met and the comparison result C is enabled to set $d_i^{S_v}$. Note that the select signal SEL is '1' when $W_i$ and $-Z_i$ both have the same sign. Accordingly, the 6-bit multiplexer 320 selects $-Z_i[5:0]$ as the input to the 6-bit comparator 330 so that the comparison result C is generated irrespective of the sign by comparing the magnitude of $W_i[5:0]$ and $-Z_i[5:0]$. It should be appreciated by those skilled in the art that either the combinational-logic circuit 340 or 350 is contemplated to provide the select signal SEL by the principles of the invention.

In light of the foregoing description, it is shown that the combinational-logic circuits 340 and 350 can reduce the number of comparisons required during the ACS operation. If necessary, AND gates 401a–d, NAND gate 403, OR gate 405a, and NOT gate 409a–b are shared between the combinational-logic circuits 340 and 350 to reduce circuit complexity. With the 6-bit multiplexer 320, the 6-bit unsigned comparator 330 is capable of serving $Z_i[5:0]$ and $-Z_i[5:0]$ one at a time. This is because $W_i$ and $Z_i$ are the same sign while $W_i$ and $-Z_i$ have opposite signs, and vice versa. By sharing the 6-bit unsigned comparator 330 between even state $S_u$ and odd state $S_v$, further reduction in complexity and power dissipation can be accomplished. For IEEE 802.11a/g, this sharing can save a Viterbi decoder up to 32 unsigned comparators.

Turning back to FIG. 3, the adding means 360 can calculate $PM_i^{S_u}$ by selectively adding $PM_{i-1}^{S_q}$ and $BM_i^{(S_q,S_u)}$ or adding $PM_{i-1}^{S_p}$ and $BM_i^{(S_p,S_u)}$ according to $d_i^{S_u}$. Likewise, the adding means 370 can calculate $PM_i^{S_v}$ by selectively adding $PM_{i-1}^{S_q}$ and $BM_i^{(S_p,S_u)}$ or adding $PM_{i-1}^{S_p}$ and $BM_i^{(S_q,S_u)}$ according to $d_i^{S_v}$. In addition, use of the best-state decoding strategy locates the state having the smallest path metric. Typically, this can be done by comparing the path metrics of all states with subtractions. According to the invention, the unique architecture of the pth ACS unit 300 lends itself to pre-compare $PM_i^{S_u}$ and $PM_i^{S_v}$ without subtractions, whereby a saving of half the output number of path metrics at instant i can be achieved. This pre-comparison also enables the subsequent survivor memory unit 140 to gain significant reduction in latency, circuit complexity, and power consumption. In this regard, the pth ACS unit 300 preferably comprises means for predetermining a local winner state between states $S_u$ and $S_v$ at instant i based on $d_i^{S_u}$, $d_i^{S_v}$, and the sign of $W_i$ or $Z_i$. The method for predetermining a local winner state is described as follows:

Case 1: $d_i^{S_u}=0$ and $d_i^{S_v}=1$
  If $W_i \geq 0$, the local winner state is $S_v$; otherwise, the local winner state is $S_u$.
Case 2: $d_i^{S_u}=1$ and $d_i^{S_v}=0$
  If $W_i > 0$, the local winner state is $S_u$; otherwise, the local winner state is $S_v$.
Case 3: $d_i^{S_u}=0$ and $d_i^{S_v}=0$
  If $Z_i > 0$, the local winner state is $S_u$; otherwise, the local winner state is $S_v$.
Case 4: $d_i^{S_u}=1$ and $d_i^{S_v}=1$
  If $Z_i \geq 0$, the local winner state is $S_v$; otherwise, the local winner state is $S_u$.

As a result, every iteration the ACS module 130 sends current decision bits of 64 ($2^{K-1}$) states and current path metrics of 32 ($2^{K-2}$) local winner states to survivor memory unit 140.

Figure 5:
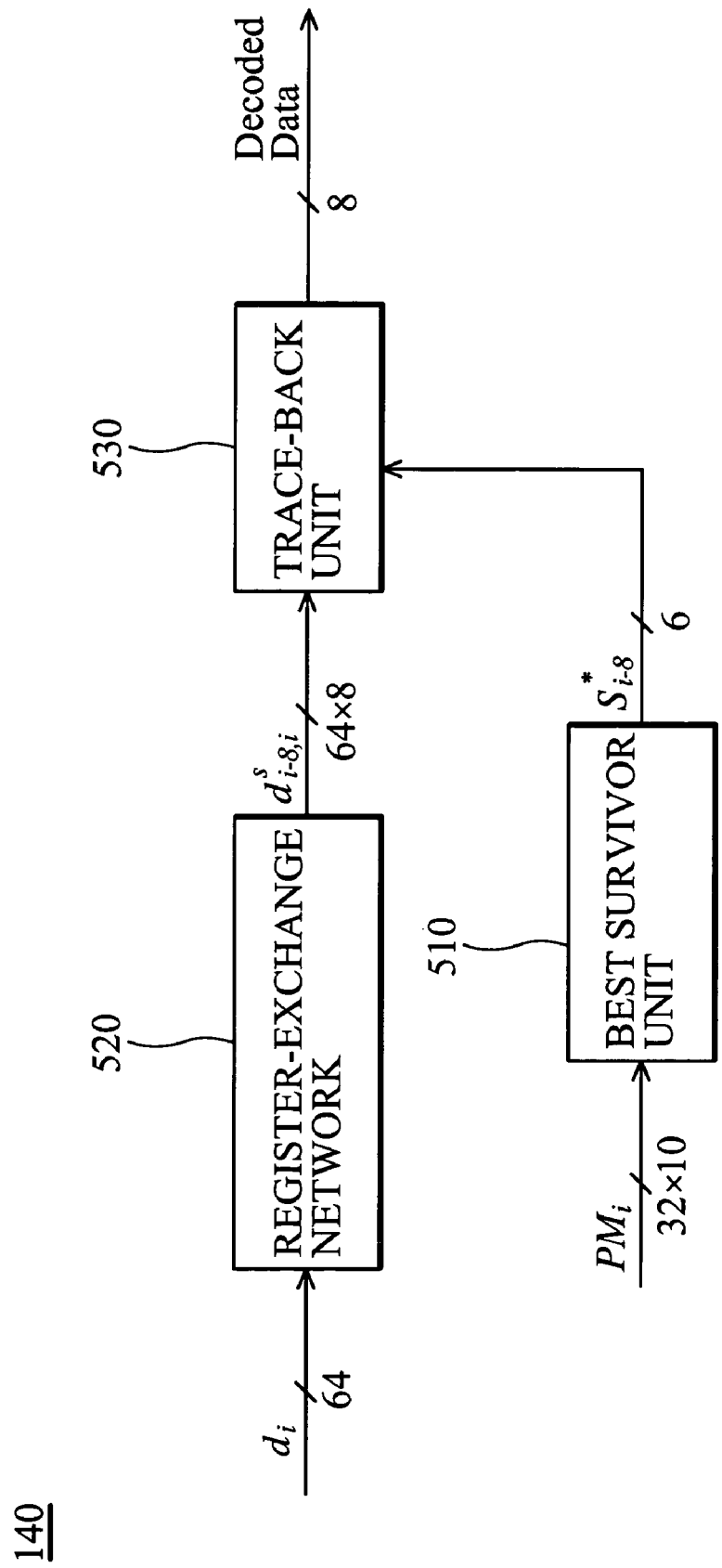
FIG. 5 is a detailed block diagram illustrating a survivor memory unit of FIG. 1 according to the invention.

The survivor memory unit 140 is a type of survivor path decoder. Referring to FIG. 5, the survivor memory unit 140 is constituted by a best survivor unit 510, a register-exchange network 520, and a trace-back unit 530. The best survivor unit 510 simultaneously receives the path metrics of 32 ($2^{K-2}$ local winner states at consecutive time instants from the ACS module 130. As stated above, each local winner state is chosen from a pair of odd and even states. Due to the elaborate design of the invention, the best survivor unit 510 needs to find a best state with the smallest path metric only once every L iterations, where the number of L is equal to a divisible factor of a data payload is length for a conformant 802.11a/g system. In one embodiment, L is equal to 8. The best survivor unit 510 includes γ 2-to-1 comparators for choosing the best state among the 32 local winner states by comparing 32 path metrics of the local winner states in 7 (L−1) iterations, leaving the 8th iteration for the best state latching into the trace-back unit 530. The number of 2-to-1 comparators, γ, is given by:

$$\gamma = \left\lceil \frac{2^{K-2} - 1}{L-1} \right\rceil$$

Therefore, γ is 5 for the conformant 802.11a/g system. In 7 ACS iterations, each of the 2-to-1 comparators is used to compare two out of 32 path metrics to find the minimum path metric among the 32 local winner states. Hence, the state associated with the minimum path metric is selected as the best state, $S^*_{i-8}$.

As depicted, the register-exchange network 520 receives the decision bits of 64 ($2^{K-1}$) states from the ACS module 130. In the register-exchange network 520, associated with every state is a register which contains the survivor path leading to that state. Each survivor path is uniquely specified by and stored as a sequence of decision bits along the survivor path. According to the decision bits from instant i−L (L=8) to instant i, decision vectors of survivor paths leading to the 64 states at instant i can be generated, respectively. For example, a decision vector of the survivor path to state S from instant i−L to i is given by the recursive update $$d_{i-L,i}^S = (d_{i-1-L,i-1}^{S'} << 1 + d_i^S)[L-1:0]$$

where S' is the predecessor state of S as determined by its decision bit $d_i^S$ from the ACS operation. The current state decision $d_i^S$ is used to select the predecessor state decision vector which is left shifted to allow $d_i^S$ to be appended to the vector. This update occurs concurrently for all states, hence the name register-exchange, since each update corresponds to an exchange of the register contents modulo the shift and append. If L=8; the above expression is rewritten as:

$$d_{i-8,i}^S = (d_{i-9,i-1}^{S'} \ll 1 + d_i^S)[7:0]$$

where the decision vector $d_{i-8,1}^S$ has a length of 8 (L) bits.

The trace-back unit 530 utilizes a backward processing algorithm for survivor path update and decode. Such an algorithm requires the decision bits to be stored in a memory prior to tracing back the survivor path. In general, the trace-back recursion estimates the previous state $S_{i-1}$ given the current state $S_i$ as the following update $$S_{i-1} = ((d_i^S \ll (K-1) + S_i) \gg 1)[K-2:0]$$

which corresponds to 1-bit right shift of the current state register with input equal to the current state decision $d_i^S$. According to the invention, the trace-back recursion from instant i to i–L can be collapsed in a single trace-back recursion of the form $$S_{i-L} = ((d_{i-L,i}^S \ll (K-1) + S_i) \gg L)[K-2:0]$$

If L=8 and K=7; the above expression can be rewritten as:

$$S_{i-8} = ((d_{i-8,i}^S \ll 6 + S_i) \gg 8)[5:0] = d_{i-8,i}^S[7:2]$$

which means that the predecessor state at instant i–8 is determined by 6 MSBs of the survivor path sequence from the state S at instant i, $d_{i-8,i}^S[7:2]$. As described earlier, the register-exchange network 520 of length L is capable of calculating the survivor path sequence from instant i–L to i for each state (i.e., the decision vector $d_{i-8,i}^S$) prior to trace-back. Using this pretrace-back technique, the trace-back recursion iterates from instant i to i–L in a single trace-back operation. Accordingly, every 8 (L) iterations the best state and the decision vectors of all states are fed to the trace-back unit 530. Then the trace-back unit 530 stores the decision vectors of the 64 states and finds a global survivor path sequence by following the decision vectors back from the best state at instant i–8, $S^*_{i-8}$. In this manner, 8 decoded bits are output from the trace-back unit 530 every 8 iterations. More particularly, the novel design of the survivor memory unit 140 reduces the required chip area and power consumption compared to conventional techniques.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An add-compare-select apparatus for a Viterbi decoder with a constraint length of K, comprising:

a subtractor for calculating a path metric difference by subtracting said path metric of state $S_q$ at instant i–1 from another path metric of state $S_p$ at instant i–1, where said path metrics are represented by $\alpha$ bits of precision;

a $\lambda$-bit multiplexer for selectively providing an output between $\lambda$ least significant bits of a branch metric difference at instant i and the negative thereof according to a select signal, where said branch metric difference is represented by $\beta$ bits of precision and $\beta = \lambda + 1$;

a $\lambda$-bit unsigned comparator for yielding a comparison result by comparing the magnitude of $\lambda$ least significant bits of said $\alpha$-bit path metric difference and the magnitude of said $\lambda$-bit multiplexer output;

a first combinational-logic circuit for logically operating $\delta$ most significant bits of said $\alpha$-bit path metric difference and a sign bit of said branch metric difference at instant i to predetermine whether the magnitude of said $\alpha$-bit path metric difference is greater than that of said branch metric difference, setting a decision bit of state $S_u$ at instant i based on a predetermination made therein if said predetermination is met, and setting said decision bit of state $S_u$ at instant i to be consistent with said comparison result if said predetermination is not met, where $\delta = \alpha - \lambda$;

a second combinational-logic circuit for logically operating $\delta$ most significant bits of said $\alpha$-bit path metric difference and said sign bit of said branch metric difference at instant i to predetermine whether the magnitude of said $\alpha$-bit path metric difference is greater than that of the negative of said branch metric difference, setting a decision bit of state $S_v$ at instant i based on another predetermination made therein if said another predetermination is met, and setting said decision bit of state $S_v$ at instant i to be consistent with said comparison result if said another predetermination is not met;

a first adding means, according to said decision bit of state $S_u$ at instant i, for calculating a new path metric for state $S_u$ at instant i by selectively adding said path metric of state $S_q$ at instant i–1 and a branch metric of a transition from state $S_q$ to state $S_u$ at instant i or adding said another path metric of state $S_p$ at instant i–1 and another branch metric of a second transition from state $S_p$ to state $S_u$ at instant i, where said branch metrics are represented by $\lambda$ bits of precision; and a second adding means, according to said decision bit of state $S_v$ at instant i, for calculating another new path metric for state $S_v$ at instant i by selectively adding said path metric of state $S_q$ at instant i–1 and said another branch metric of said second transition from state $S_p$ to state $S_u$ at instant i or adding said another path metric of state $S_p$ at instant i–1 and said branch metric of said transition from state $S_q$ to state $S_u$ at instant i;

wherein said branch metric difference is pre-calculated by subtracting said another branch metric of said second transition from state $S_p$ to state $S_u$ at instant i from said branch metric of said transition from state $S_q$ to state $S_u$ at instant i;

wherein states $S_p$ and $S_q$ at instant i–1 and states $S_u$ and $S_v$ at instant i are organized in a butterfly trellis structure, and subscripts p, q, u and v are given by:

$p = 0, 1, 2, \ldots, 2^{K-2} - 1$ $q = 2^{K-2} + p$ $u = 2p$ $v = 2p + 1$.

2. The apparatus as recited in claim 1 wherein said first combinational-logic circuit is capable of setting said select signal depending on whether said branch metric difference at instant i and said path metric difference at instant i−1 both have the same sign.

3. The apparatus as recited in claim 1 wherein said second combinational-logic circuit is capable of setting said select signal depending on whether said branch metric difference at instant i and said path metric difference at instant i−1 both have the same sign.

4. The apparatus as recited in claim 1 further comprising means for predetermining a local winner state between states $S_u$ and $S_v$ at instant i based on said decision bits of states $S_u$ and $S_v$ at instant i, and the sign of said path metric difference at instant i−1 or the sign of said branch metric difference at instant i, whereby a saving of half the output number of said new path metrics at instant i is achieved.

5. An apparatus for branch metric computation and add-compare-select operation in a rate 1/n Viterbi decoder with a constraint length of K, comprising:

a branch metric generator receiving a data symbol including n decision metrics in Q-bit representation, for calculating a plurality of branch metrics each of which is a measure between said currently received data symbol and a corresponding branch label, and further pre-calculating a branch metric difference by subtracting a first branch metric of a transition from state $S_p$ to state $S_u$ at instant i from a second branch metric of another transition from state $S_q$ to state $S_u$ at instant i; and an add-compare-select unit receiving said first branch metric of said transition from state $S_p$ to state $S_u$, said second branch metric of said another transition from state $S_q$ to state $S_u$ and said branch metric difference at instant i from said branch metric generator and calculating a path metric difference between a path metric of state $S_p$ at instant i−1 and another path metric of state $S_q$ at instant i−1, for respectively setting decision bits of states $S_u$ and $S_v$ at instant i based on said branch metric difference at instant i and said path metric difference, comprising:

a first adding means, according to said decision bit of state $S_u$ at instant i, for calculating a new path metric for state $S_u$ at instant i by selectively adding said another path metric of state $S_q$ at instant i−1 and said second branch metric of said another transition from state $S_q$ to state $S_u$ at instant i or adding said path metric of state $S_p$ at instant i−1 and said first branch metric of said transition from state $S_p$ to state $S_u$ at instant i;

a second adding means, according to said decision bit of state $S_v$ at instant i, for calculating another new path metric for state $S_v$ at instant i by selectively adding said another path metric of state $S_q$ at instant i−1 and said first branch metric of said transition from state $S_p$ to state $S_u$ at instant i or adding said path metric of state $S_p$ at instant i−1 and said second branch metric of said another transition from state $S_q$ to state $S_u$ at instant i; and means for selectively outputting one of said new path metrics, which is a survivor path metric of a local winner state, by predetermining said local winner state between states $S_u$ and $S_v$ at instant i based on said decision bits of states $S_u$ and $S_v$ at instant i, and the sign of said path metric difference at instant i−1 or the sign of said branch metric difference at instant i;

wherein states $S_p$ and $S_q$ at instant i−1 and states $S_u$ and $S_v$ at instant i are organized in a butterfly trellis structure, and subscripts p, q, u and v are given by:

$p=0, 1, 2, \ldots, 2^{K-2}-1$ $q=2^{K-2}+p$ $u=2p$ $v=2p+1$.

6. The apparatus as recited in claim 5 wherein said add-compare-select unit further comprises:

a subtractor for calculating said path metric difference by subtracting said another path metric of state $S_q$ at instant i−1 from said path metric of state $S_p$ at instant i−1, where said path metrics are represented by α bits of precision, respectively;

a λ-bit multiplexer for selectively providing an output between λ least significant bits of said branch metric difference at instant i and the negative thereof according to a select signal, where said branch metric difference is represented by β bits of precision and β=λ+1;

a λ-bit unsigned comparator for yielding a comparison result by comparing the magnitude of λ least significant bits of said α-bit path metric difference and the magnitude of said λ-bit multiplexer output;

a first combinational-logic circuit for logically operating δ most significant bits of said α-bit path metric difference and a sign bit of said branch metric difference at instant i to predetermine whether the magnitude of said α-bit path metric difference is greater than that of said branch metric difference, setting said decision bit of state $S_u$ at instant i based on a predetermination made therein if said predetermination is met, and setting said decision bit of state $S_u$ at instant i to be consistent with said comparison result if said predetermination is not met, where δ=α−λ; and a second combinational-logic circuit for logically operating δ most significant bits of said α-bit path metric difference and said sign bit of said branch metric difference at instant i to predetermine whether the magnitude of said α-bit path metric difference is greater than that of the negative of said branch metric difference, setting said decision bit of state $S_v$ at instant i based on another predetermination made therein if said another predetermination is met, and setting said decision bit of state $S_v$ at instant i to be consistent with said comparison result if said another predetermination is not met.

7. The apparatus as recited in claim 6 wherein said first combinational-logic circuit is capable of setting said select signal depending on whether said branch metric difference at instant i and said path metric difference at instant i−1 both have the same sign.

8. The apparatus as recited in claim 6 wherein said second combinational-logic circuit is capable of setting said select signal depending on whether said branch metric difference at instant i and said path metric difference at instant i−1 both have the same sign.

9. The apparatus as recited in claim 6 wherein said branch metrics are represented by λ bits of precision, in which λ is given by:

$\lambda=Q+n-1$.

10. The apparatus as recited in claim 9 wherein the number of bits of precision representing said path metrics, $\alpha$, is given by:

$$\alpha=1+\lceil \log_2(n \cdot K(2^Q-1)) \rceil$$

where $\lceil \cdot \rceil$ denotes a ceiling function.

11. The apparatus as recited in claim 5 further comprising:
a dummy insertion unit for performing a dummy insertion procedure inverse to a bit-stealing procedure in a transmitter according to a puncturing pattern and outputting a dummy insertion flag to indicate a position at which a dummy value is inserted into said decision metrics.

12. The apparatus as recited in claim 11 wherein said branch metric generator ignores said inserted dummy value in response to said dummy insertion flag when calculating said branch metrics for said n decision metrics including said inserted dummy value.

13. A rate 1/n Viterbi decoder with a constraint length of K, comprising:
a dummy insertion unit for performing a dummy insertion procedure, which is inverse to a bit-stealing procedure in a transmitter, on a sequence of decision metrics in Q-bit representation according to a puncturing pattern and outputting a dummy insertion flag to indicate a position at which a dummy value is inserted into said decision metrics;
a branch metric generator receiving n number of said decision metrics including said dummy value to group into a data symbol, for calculating a plurality of branch metrics each of which is a measure between said data symbol and a corresponding branch label, and further pre-calculating a branch metric difference for a pth sub-group of states including states $S_p$, $S_q$, $S_u$ and $S_v$ by subtracting a first branch metric of a transition from state $S_p$ to state $S_u$ at instant i from a second branch metric of another transition from state $S_q$ to state $S_u$ at instant i, wherein said dummy value is ignored in response to said dummy insertion flag when said branch metrics are calculated for said data symbol;
P add-compare-select units, in which a pth add-compare-select unit receives said first branch metric of said transition from state $S_p$ to state $S_u$, said second branch metric of said another transition from state $S_q$ to state $S_u$ and said branch metric difference for the pth sub-group of states at instant i from said branch metric generator and calculates a path metric difference between a path metric of state $S_p$ at instant i−1 and another path metric of state $S_q$ at instant i−1, for setting a pair of decision bits for states $S_u$ and $S_v$ at instant i based on said branch metric difference at instant i and said path metric difference, respectively generating new path metrics for states $S_u$ and $S_v$ at instant i, further predetermining a local winner state between states $S_u$ and $S_v$ at instant i based on said decision bits of states $S_u$ and $S_v$ at instant i, and the sign of said branch metric difference at instant i or the sign of said path metric difference, and providing one of said new path metrics as output, which is a survivor path metric of said local winner state at instant i, to achieve a saving of half the output number of said new path metrics; and
a survivor memory unit receiving said P survivor path metrics of said P local winner states and said P pairs of decision bits at instant i from said P add-compare-select units, for storing survivor path sequences and yielding a decoded bit sequence;

wherein states $S_p$ and $S_q$ at instant i−1 and states $S_u$ and $S_v$ at instant i are organized in a butterfly trellis structure, and subscripts p, q, u and v are given by:

$p=0, 1, 2, \ldots, P-1$ $q=P+p$ $u=2p$ $v=2p+1$ where $P=2^{K-2}$.

14. The Viterbi decoder as recited in claim 13 wherein the pth add-compare-select unit comprises:
a subtractor for calculating said path metric difference by subtracting said another path metric of state $S_q$ at instant i−1 from said path metric of state $S_p$ at instant i−1, where said path metrics are represented by $\alpha$ bits of precision, respectively;
a $\lambda$-bit multiplexer for selectively providing an output between $\lambda$ least significant bits of said branch metric difference at instant i and the negative thereof according to a select signal, where said branch metric difference is represented by $\beta$ bits of precision and $\beta=\lambda+1$;
a $\lambda$-bit unsigned comparator for yielding a comparison result by comparing the magnitude of $\lambda$ least significant bits of said $\alpha$-bit path metric difference and the magnitude of said $\lambda$-bit multiplexer output;
a first combinational-logic circuit for logically operating $\delta$ most significant bits of said $\alpha$-bit path metric difference and a sign bit of said branch metric difference at instant i to predetermine whether the magnitude of said $\alpha$-bit path metric difference is greater than that of said branch metric difference, setting said decision bit of state $S_u$ at instant i based on a predetermination made therein if said predetermination is met, and setting said decision bit of state $S_u$ at instant i to be consistent with said comparison result if said predetermination is not met, where $\delta=\alpha-\lambda$; and
a second combinational-logic circuit for logically operating $\delta$ most significant bits of said $\alpha$-bit path metric difference and said sign bit of said branch metric difference at instant i to predetermine whether the magnitude of said $\alpha$-bit path metric difference is greater than that of the negative of said branch metric difference, setting said decision bit of state $S_v$ at instant i based on another predetermination made therein if said another predetermination is met, and setting said decision bit of state $S_v$ at instant i to be consistent with said comparison result if said another predetermination is not met.

15. The Viterbi decoder as recited in claim 14 wherein the pth add-compare-select unit further comprises:
a first adding means, according to said decision bit of state $S_u$ at instant i, for calculating said new path metric of state $S_u$ at instant i by selectively adding said another path metric of state $S_q$ at instant i−1 and said second branch metric of said another transition from state $S_q$ to state $S_u$ at instant i or adding said path metric of state $S_p$ at instant i−1 and said first branch metric of said transition from state $S_p$ to state $S_u$ at instant i; and
a second adding means, according to said decision bit of state $S_v$ at instant i, for calculating said new path metric of state $S_v$ at instant i by selectively adding said another path metric of state $S_q$ at instant i−1 and said first branch metric of said transition from state $S_p$ to state $S_u$ at instant i or adding said path metric of state $S_p$ at instant i−1 and said second branch metric of said another transition from state $S_q$ to state $S_u$ at instant i.

16. The Viterbi decoder as recited in claim 14 wherein said first combinational-logic circuit is capable of setting said select signal depending on whether said branch metric difference at instant i and said path metric difference at instant i−1 both have the same sign.

17. The Viterbi decoder as recited in claim 14 wherein said second combinational-logic circuit is capable of setting said select signal depending on whether said branch metric difference at instant i and said path metric difference at instant i−1 both have the same sign.

18. The Viterbi decoder as recited in claim 14 wherein said branch metrics are represented by $\lambda$ bits of precision, in which $\lambda$ is given by:

$$\lambda = Q + n - 1.$$

19. The Viterbi decoder as recited in claim 14 wherein the number of bits of precision representing said path metrics, $\alpha$, is given by:

$$\alpha = 1 + \lceil \log_2(n \cdot K(2^Q - 1)) \rceil$$

where $\lceil \cdot \rceil$ denotes a ceiling function.

20. The Viterbi decoder as recited in claim 13 wherein said decision metrics are hard-decision data if quantized to one bit of precision.

* * * * *